(12) United States Patent
Forte et al.

(10) Patent No.: US 7,667,537 B2
(45) Date of Patent: Feb. 23, 2010

(54) METHOD FOR CORRECTING A HARMONIC DISTORTION OF A POWER BRIDGE, IN PARTICULAR FOR A CLASS D AMPLIFIER

(75) Inventors: Federico Forte, Novara (IT); Marcello Gagliardi, Novara (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 51 days.

(21) Appl. No.: 11/584,245

(22) Filed: Oct. 20, 2006

(65) Prior Publication Data

US 2007/0091654 A1 Apr. 26, 2007

(30) Foreign Application Priority Data

Oct. 21, 2005 (EP) ................... 05425744
Jun. 23, 2006 (EP) ................... 06012940

(51) Int. Cl.
*H03F 1/26* (2006.01)
(52) U.S. Cl. ............................ 330/10; 330/149; 330/151
(58) Field of Classification Search .................. 330/10, 330/149, 151
See application file for complete search history.

(56) References Cited

U.S. PATENT DOCUMENTS 5,617,058 A * 4/1997 Adrian et al. .................. 330/10
6,404,280 B1 6/2002 Jeng et al.

FOREIGN PATENT DOCUMENTS

WO WO 2004/049561 A1 6/2004
WO WO 2005/036734 A1 4/2005

OTHER PUBLICATIONS

European Search Report, EP 06 01 2940, dated Nov. 13, 2006.
Jun Honda and Jorge Cereza, International Rectifier, "Class D Audio Amplifier Design," www.irf.com, dated Oct. 8, 2003.
W. Marshall Leach, Jr., "Class-D Amplifier", excerpt from the book *Introduction to Electroacoustics and Audio Amplifier Design*, Second Edition, Revised Printing 2001.
Jun Honda & Jonathan Adams, International Rectifier, Application Note AN-1071, "Class D Audio Amplifier Basics," www.irf.com, dated Feb. 8, 2005.

* cited by examiner

*Primary Examiner*—Michael B Shingleton
(74) *Attorney, Agent, or Firm*—Gardere Wynne Sewell LLP (57) ABSTRACT

To correct for harmonic distortion of a power bridge, the form of a pulse at the output of the power bridge and of estimate of non idealities under different current conditions is acquired. An estimate of a current at the output of the power bridge is also acquired. The switching control signal applied to the power bridge is then regulated based on the acquired estimates. More specifically, an area error introduced by the estimated non-idealities of the power bridge for a certain output current is determined and the edges of the switching control signal input to the power bridge are temporally shifted in response to the determined area error so as to account for the determined area error and correct for harmonic distortion concerns in the output signal.

8 Claims, 8 Drawing Sheets

METHOD FOR CORRECTING A HARMONIC DISTORTION OF A POWER BRIDGE, IN PARTICULAR FOR A CLASS D AMPLIFIER

PRIORITY CLAIM

The present application claims priority from European Patent Application No. 05425744.9 filed Oct. 21, 2005, and from European Patent Application No. 06012940.0 filed Jun. 23, 2006, the disclosures of which is hereby incorporated by reference.

BACKGROUND OF THE INVENTION

1. Technical Field of the Invention

The present invention relates to a method for correcting the harmonic distortion of a power bridge.

The invention also relates to a compensation system.

The invention particularly, but not exclusively, relates to a method for compensating a harmonic distortion introduced by a power bridge in a class D amplifier and the following description is made with reference to this field of application for simplifying the illustration only.

2. Description of Related Art

As is well known, class D amplifiers currently for sale use an analog or digital modulator of the PWM type for driving a power bridge. The non idealities in the power bridge are responsible for an increase in harmonic distortion that can be measured downstream of this amplifier (for example, in the load).

To overcome this problem, the use of systems comprising a class D amplifier and a feedback path is known. In particular, these systems with feedback measure a signal at the output of the class D amplifier and report this information to the input of the modulator for calculating the error made.

The systems with feedback, however, require specific additional components (such as integrators, comparators, analog-to-digital converters) which increase the cost of the system as a whole.

Systems are also known comprising class D amplifiers in an open loop configuration which include at least one estimation block for estimating and providing the error on a signal at the output of the amplifier. The system then acts on the modulator for compensating in advance of this estimated and provided error.

These open loop systems do not give efficient results in practice as regards the decrease of the distortion introduced by a power bridge of a class D amplifier.

A need accordingly exists for providing a method for compensating a system comprising a class D amplifier, having such structural and functional characteristics as to reduce the harmonic distortion introduced by the power bridge of the amplifier overcoming the limits and drawbacks still affecting the systems realized according to the prior art.

SUMMARY OF THE INVENTION

An embodiment of the present invention performs a correction in open loop of the pulse area error based on the estimate of a current at the output of the power bridge, in particular comprised in a class D amplifier.

In an embodiment, a method for correcting the harmonic distortion of a power bridge, comprises acquisition of the form of a pulse at the output of said power bridge and of estimation of non idealities under different current conditions, estimation of a current at the output of said power bridge, and compensation with regulation of a control signal to be applied to said power bridge for its switch.

In another embodiment, an open loop compensation system of a power bridge, in particular for a class D amplifier, comprises a modeling block of said power bridge receiving an input signal and supplying a non compensated output signal, an open loop compensation block connected at its input to said modeling block and suitable for supplying at its output a compensated output signal, a storage block suitable for storing a table of non idealities and connected to said modeling block, and a block of acquisition and estimation of non idealities connected to said storage block.

In an embodiment, a system comprises a power bridge receiving at its input a switching control signal and generating an output signal, an estimation circuit which estimates non-idealities of the power bridge under different current conditions and estimates output current of the power bridge, and a compensation circuit operable to determine an area error introduced by the estimated non-idealities of the power bridge for a certain output current and temporally shift edges of the switching control signal input to the power bridge in response thereto so as to account for the determined area error and correct for harmonic distortion concerns in the output signal.

In another embodiment, a method for compensating a power bridge which receives at its input a switching control signal and generating an output signal comprises estimating non-idealities of the power bridge under different current conditions, estimating output current of the power bridge, determining an area error introduced by the estimated non-idealities of the power bridge for a certain output current, and temporally shifting edges of the switching control signal input to the power bridge in response to the determined area error so as to account for the determined area error and correct for harmonic distortion concerns in the output signal.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

The present invention is based on the consideration that the harmonic distortion introduced by a power bridge in a class D amplifier (which includes a pulse width modulator) can be reduced through a correction in open loop of a pulse area error of the bridge output pulse signal, which is the main cause of harmonic distortion. In particular, this correction is advantageously based on an estimate of an output current from the bridge, which is primarily responsible for variation in the output pulse area that causes harmonic distortion.

It is to be noted that the solution proposed belongs to the category of an open loop solution, and is based on the fact that the non idealities of the power bridge vary in time according to the current flowing outwards from the bridge itself.

Advantageously according to the invention, through an accurate estimate of this bridge output current, it is thus possible to determine how the form of the pulse edges at the output of the bridge need to be modified in order to address the error. The effective area of the bridge output pulse is estimated and a determination made as to how much that area departs from a desired area of the output pulse (i.e., a pulse which would not include or cause harmonic distortion). A correction is then made to the pulse width modulated control signal applied by the PWM modulator to the power bridge so that the resulting bridge output pulse has an effective area minimally different from the desired area and thus less likely to induce harmonic distortion.

The invention starts from the consideration that the error in bridge output pulse area predominantly affects and influences the harmonic distortion. On the basis of an accurate estimate of the current flowing outwards from the bridge in the bridge output pulse, the method for correcting the harmonic distortion according to the invention enables the system to decide whether to anticipate (advance) or postpone (delay) in time a control signal to be applied to the switches of the power bridge. By adjusting the timing of the bridge switch control signal, control is exercised over the shape of the bridge output pulse in an open loop correction so that the output pulse area substantially matches a desired area value.

Advantageously according to the invention, the method for correcting the harmonic distortion, in particular the harmonic distortion introduced by the power bridge in a class D amplifier which comprises a pulse width modulator supplying PWM control signals to the power bridge, generally comprises the following steps:

Step 1: with respect to different bridge output current conditions, acquiring a form of a pulse at the output of the power bridge along with an estimation of non idealities of that bridge output pulse;

Step 2: estimating a current of the power bridge output pulse and using that estimate to determine non idealities of the associated output pulse, and Step 3: compensating by regulation the edge timing of a pulse width modulated control signal to be applied to switches of the power bridge in view of the determined non idealities.

Figure 1A:
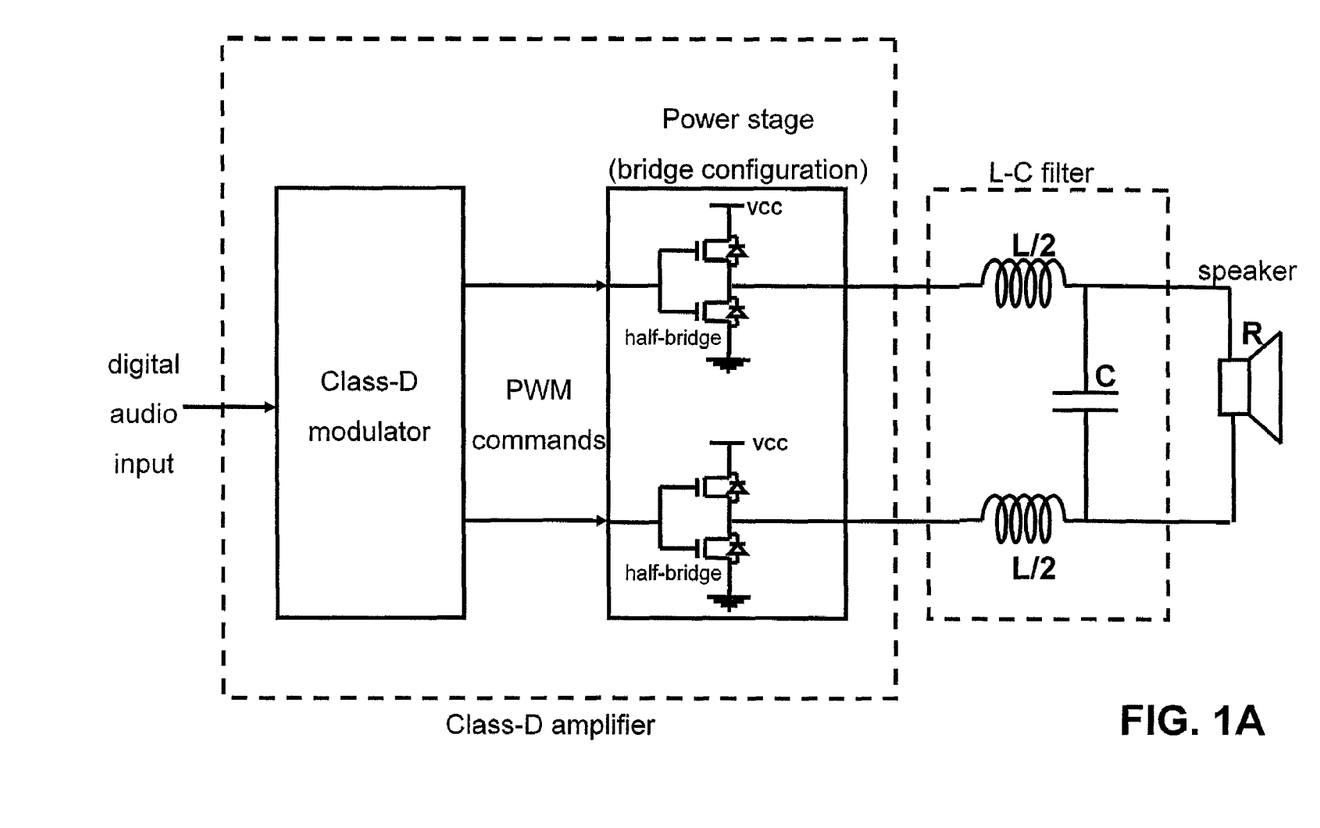
FIG. 1A shows a class-D amplifier system with a PWM modulator and power bridge.

FIG. 1A shows a system in which a PWM modulator (in the form of a Class-D modulator) receives an input audio signal and generates PWM control signals applied to a power bridge formed of two half-bridge circuits, that power bridge driving a load (comprising in an exemplary audio implementation an LC filter and speaker). While the general configuration of the system shown in FIG. 1A is well known in the prior art, the operation of the PWM modulator in the present invention in response to the input audio signal is controlled so that PWM output control signals are generated for application to the power bridge in a way which reduces concerns with harmonic distortion. The shape of the output pulse from each half-bridge circuit can, as discussed above, introduce harmonic distortion in the load. The area of that output pulse may, under certain conditions, differ from a desired area and this difference constitutes an error which contributes to harmonic distortion. Control over the PWM output signals in the manner discussed herein addresses this potential distortion.

The method for correcting the harmonic distortion according to the invention is implemented by an open loop compensation system for a class D amplifier connected to a PWM modulator of the type shown in FIG. 1A so as to correct for harmonic distortion introduced by the power bridge of the amplifier.

Figure 1B:
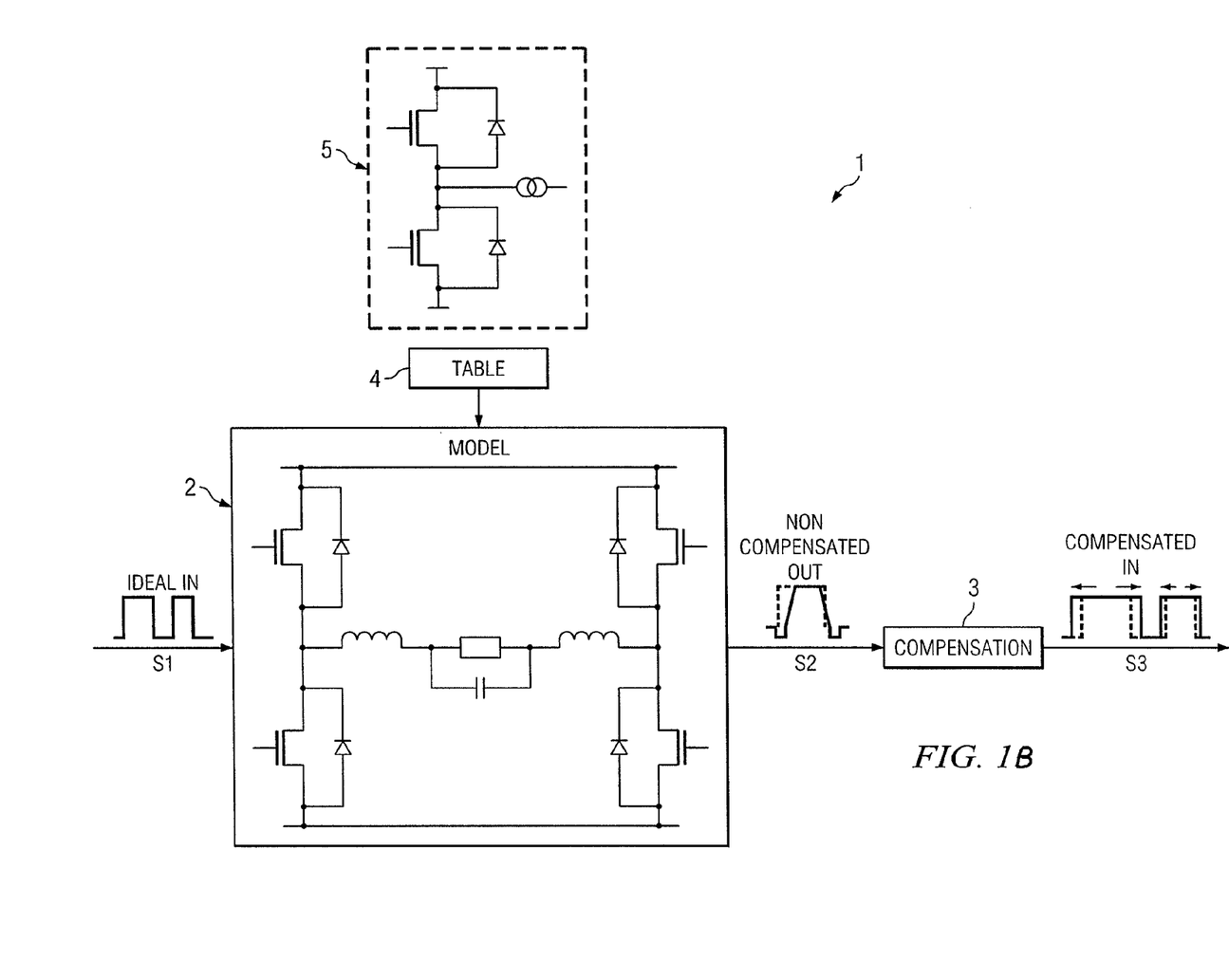
FIG. 1B shows a block diagram of an operation principle for a compensation system suitable for implementing a correction method of harmonic distortion according to the invention in a system such as that shown in FIG. 1A.

Reference is now made to FIG. 1B which shows a block diagram of an operation principle for a compensation system suitable for implementing a correction method of harmonic distortion according to the invention, the compensation system being globally indicated with reference 1.

The compensation system 1 essentially comprises a modeling block 2 which includes a model of a power bridge of a class D amplifier. An input PWM signal S1, which in this example comprises a train of pulses having a predetermined frequency but varying pulse width derived from an input (for example, audio) signal, is applied to the switches of the modeled power bridge in the modeling block. Responsive thereto, the modeling block produces a non compensated power bridge output signal S2. The non-compensated bridge output signal is shown as a solid line waveform, while the ideal bridge output signal is shown as a dotted line waveform.

Advantageously according to the invention, the output of modeling block 2 is connected at its output to an open loop compensation block 3. The open loop compensation block 3 receives the non-compensated output signal S2, processes that signal to determine error and then determines how the input PWM signal S1 would need to be modified in order to remove the determined error in the non-compensated output signal S2. The result is the generation of a compensated IN PWM output signal S3 which can be applied to the switches of a power bridge to produce an output signal absent harmonic distortion. The compensated output signal S3 is shown as a solid line waveform, while the input signal S1 is shown as a dotted line waveform for comparison. As discussed above, the compensation system decides, based on its analysis of the non-compensated output signal S2, whether to anticipate (advance) or postpone (delay) in time the control signal to be applied to the switches of the power bridge (i.e., the input signal to the bridge). These actions to anticipate (advance) or postpone (delay) in time are shown by the arrows associated with compensated input signal S3 and the difference between the edges of the input signal S1 and the compensated input signal S3.

Moreover, the modeling block 2 is connected to receive input from a storage block 4. The storage block 4 stores a table of non idealities, these non-idealities comprising values (obtaining in a manner to be described) which represent operation of power bridge circuits. These values are used by the modeling block 2 in processing the input signal S1 to generate the non-compensated output signal S2. A block 5 of acquisition and estimate of non idealities is provided to generate the values for storage in the table of storage block 4.

The steps according to the method of the present invention will be now described in detail.

Step 1

Step 1 is acquisition and estimation of non idealities for a power bridge circuit under different current conditions. This step is performed in connection with the block 5 of acquisition and estimate of non idealities and provides the information for populating a table of non idealities in the storage block 4. The acquisition and estimation of non idealities in step 1 initially provides for the acquisition of the form of an output pulse of the power bridge under different output current conditions of the bridge itself and provide the information for populating table of non idealities in the storage block 4.

Figure 2A:
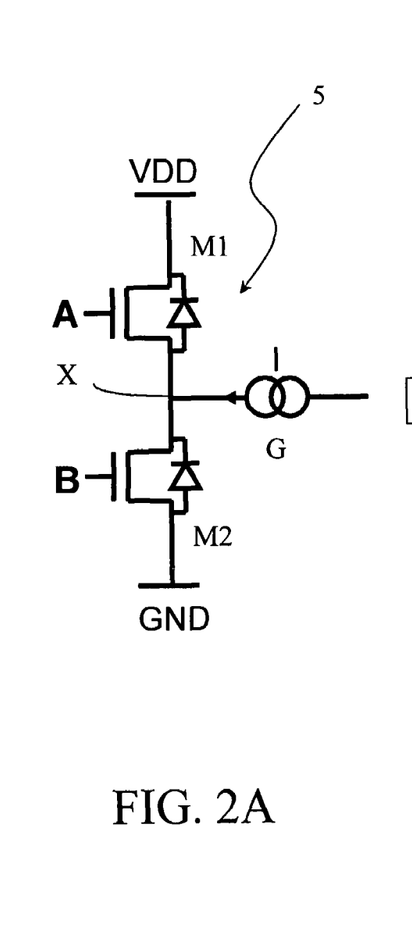
FIGS. 2A-2C schematically show a block of acquisition and estimation of non idealities, inner signals and a table of non idealities, respectively, relative to a first step of the method according to the invention.

To accomplish this, FIG. 1B shows that the block 5 of acquisition and estimate of non idealities includes a half-bridge circuit formed of two series connected transistors M1 and M2 and a current generator G producing a current I connected to the common interconnection node X of that series circuit (see, also, FIG. 2A). This circuit is used to measure the form of an output pulse of the power bridge (see, FIG. 2B) under different output current conditions of the bridge itself (for example in response to different input control signals A and B).

In this way, a relationship is in fact established between the output current and the non idealities of the bridge affecting the pulse area, allowing for an estimation of these non idealities. Substantially, the non idealities can be divided into the following categories (see, FIG. 2C):

variation of an output low level with respect to the ground, due to the fact that the system comprises a finite resistance in series to a MOS transistor used as switch, also indicated as $V_L(I)$;

variation of an output high level with respect to a supply VDD, for the same reason, also indicated as $V_H(I)$;

delay of the switching from a low level to a high level, also indicated as $T_R(I)$;

delay of switching from a high level to a low level, also indicated switch as $T_F(I)$.

It will be noted that the variations and delays discussed above are provided as functions of the current I provided by the current generator G.

The non idealities of these four categories are estimated and advantageously memorized (stored) in a table of non idealities in storage block 4 as a function of current I, which univocally characterizes the particular power bridge comprised in the open loop compensation system 1, for example for a class D amplifier.

Figure 2B:
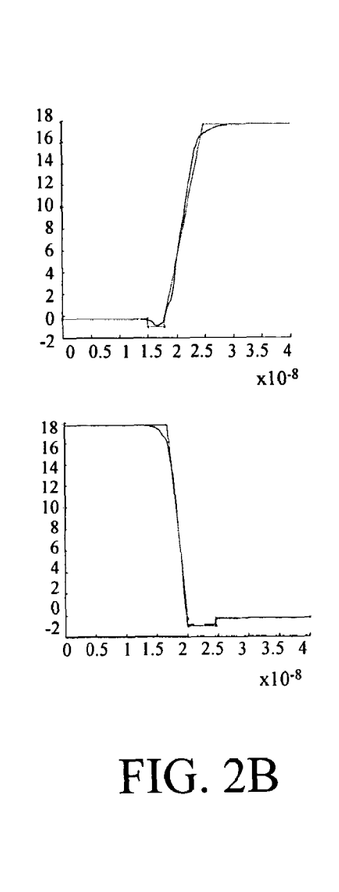
Figure 2C:
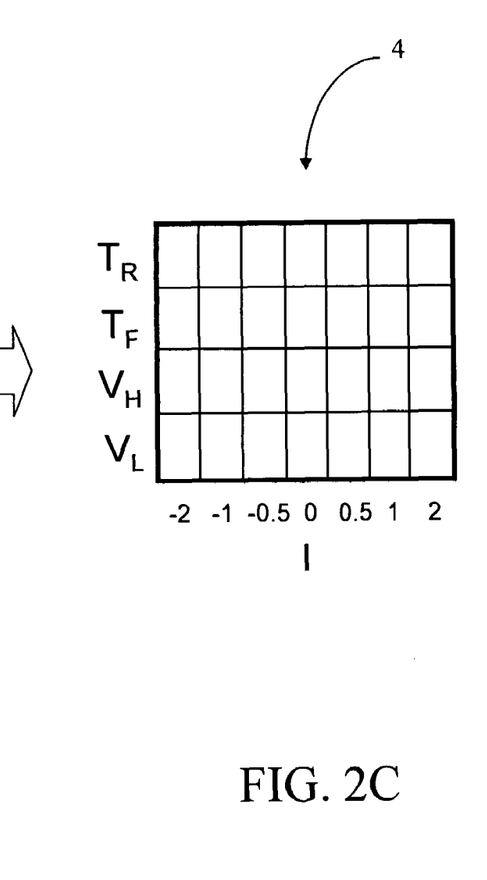

In particular, as shown in FIGS. 2A-2C, the block 5 of acquisition and estimation of non idealities comprises a first transistor M1 and a second transistor M2 of the MOS type inserted, in series to each other, between a first and a second voltage reference, in particular a supply VDD and a ground GND, and interconnected in correspondence with a circuit node X connected to a current generator G producing a current I. The transistors M1 and M2 receive respective control signals A and B on their control or gate terminals.

By varying the current I conditions by means of the current generator G, it is possible to obtain the signal patterns shown in FIG. 2B and thus to classify the non idealities according to the above indicated categories, in particular $V_L$, $V_H$, $T_F$ and $T_R$ and to store them in a table in the storage block 4, as shown in FIG. 2C.

The acquisition and estimation of non idealities under different current conditions is realized starting from circuit simulations or from direct measures on a real, already realized circuit (for example, one of the half-bridge circuits in FIG. 1A). Thus, the circuit of FIG. 2A can be either simulated or an actual half-bridge circuit.

Step 2

Step 2 is estimation of the power bridge output current.

Figure 3A:
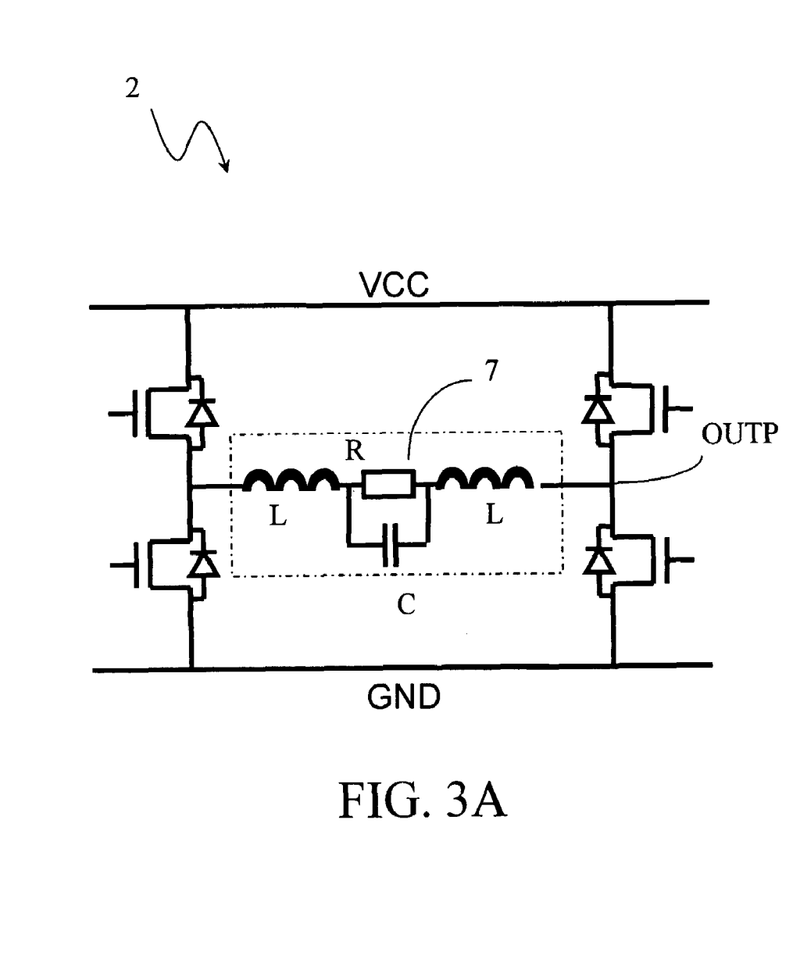
FIGS. 3A-3B schematically show a block of estimation and inner signals, respectively, relative to a second step of the method according to the invention.

This step is implemented by introducing into the modeling block 2 a filter LC 7 connected to a resistive load R and to a power output terminal OUTP of the bridge, as schematically shown in FIG. 3A. In particular, this FIG. 3A shows a symmetric configuration of the modeling block 2.

Figure 3B:
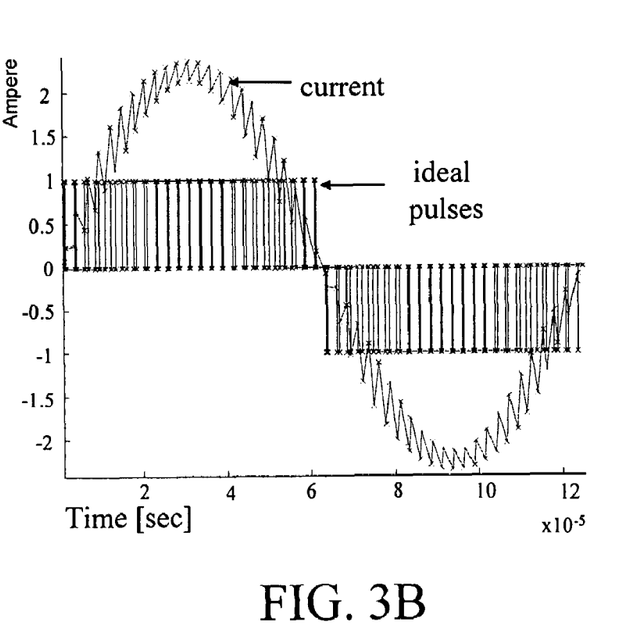

In substance, between the resistive load R and the output terminal OUTP the filter LC 7 is placed, which is a filter of the second order, the output current being the one flowing in the inductance L of this filter, as schematically shown in FIG. 3B.

In the hypothesis (in any case reasonable in real applications) that the filter LC 7 has a frequency response having a constant module (not introducing in this way different gains with different input frequencies) and a linear phase (maintaining the group delay constant) in audio band, the current in the inductance L of the filter LC 7 has a mean value given by the mean wave form in voltage of a signal at the output of the bridge scaled by a factor R and delayed by a fixed value, equal to RC-L/R.

This mean value of current is overlapped by a triangular wave progress (see, FIG. 3B), the slope of each section being linked to the value of the inductance L of the filter LC 7 and to the voltage across it, which is equal to the difference between the voltage at the output of the bridge and the voltage on the load connected thereto.

A good estimation of the voltage on the load is also known, being equal to the mean voltage at the output of the bridge delayed by a fixed value equal to L/R.

Thus, there exist all the elements for estimating, in a precise way, the current flowing from the power bridge in response to a certain PWM control signal.

Step 3

Figure 4A:
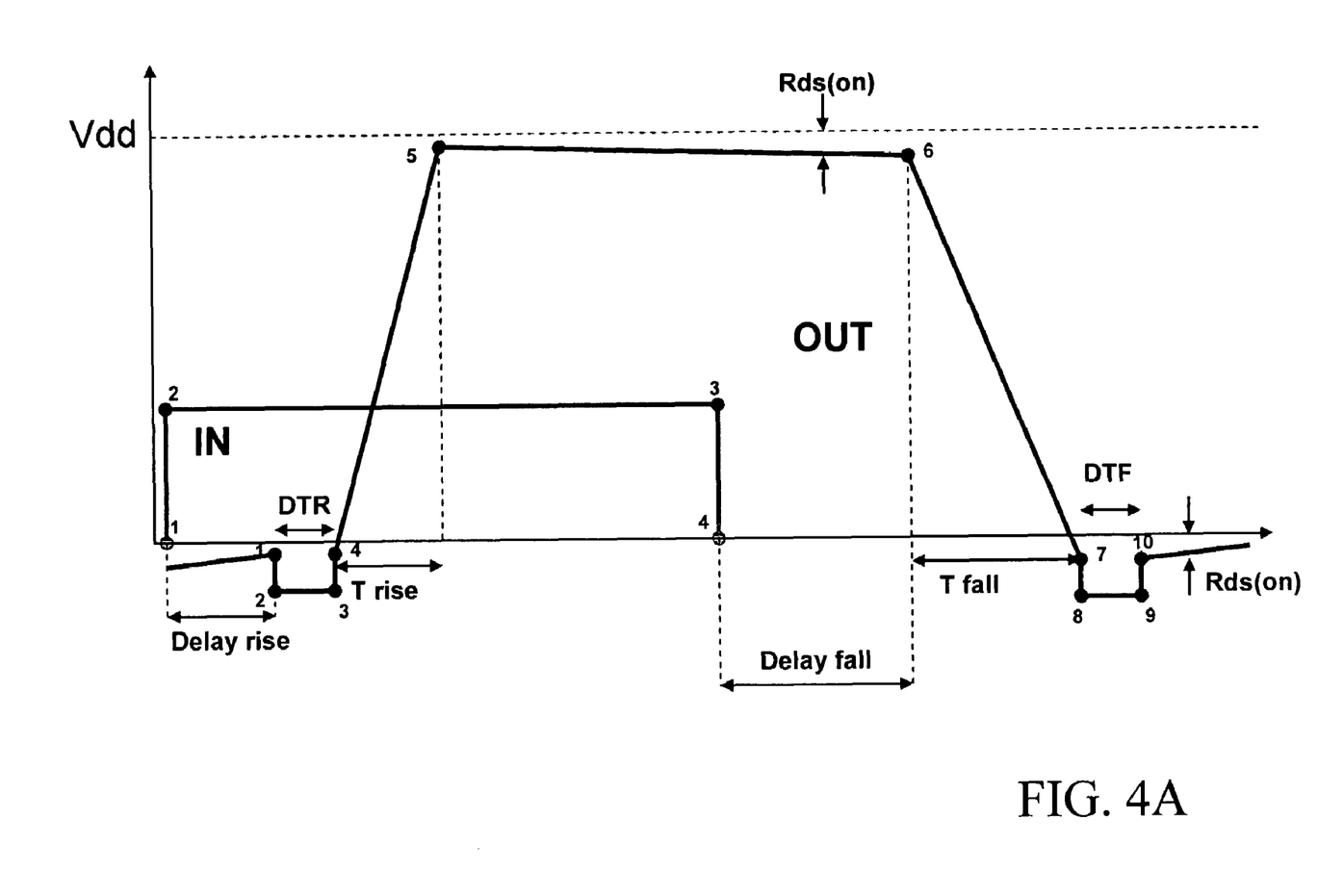
FIGS. 4A-4B schematically show wave forms relative to a third step of the method according to the invention.
Figure 4B:
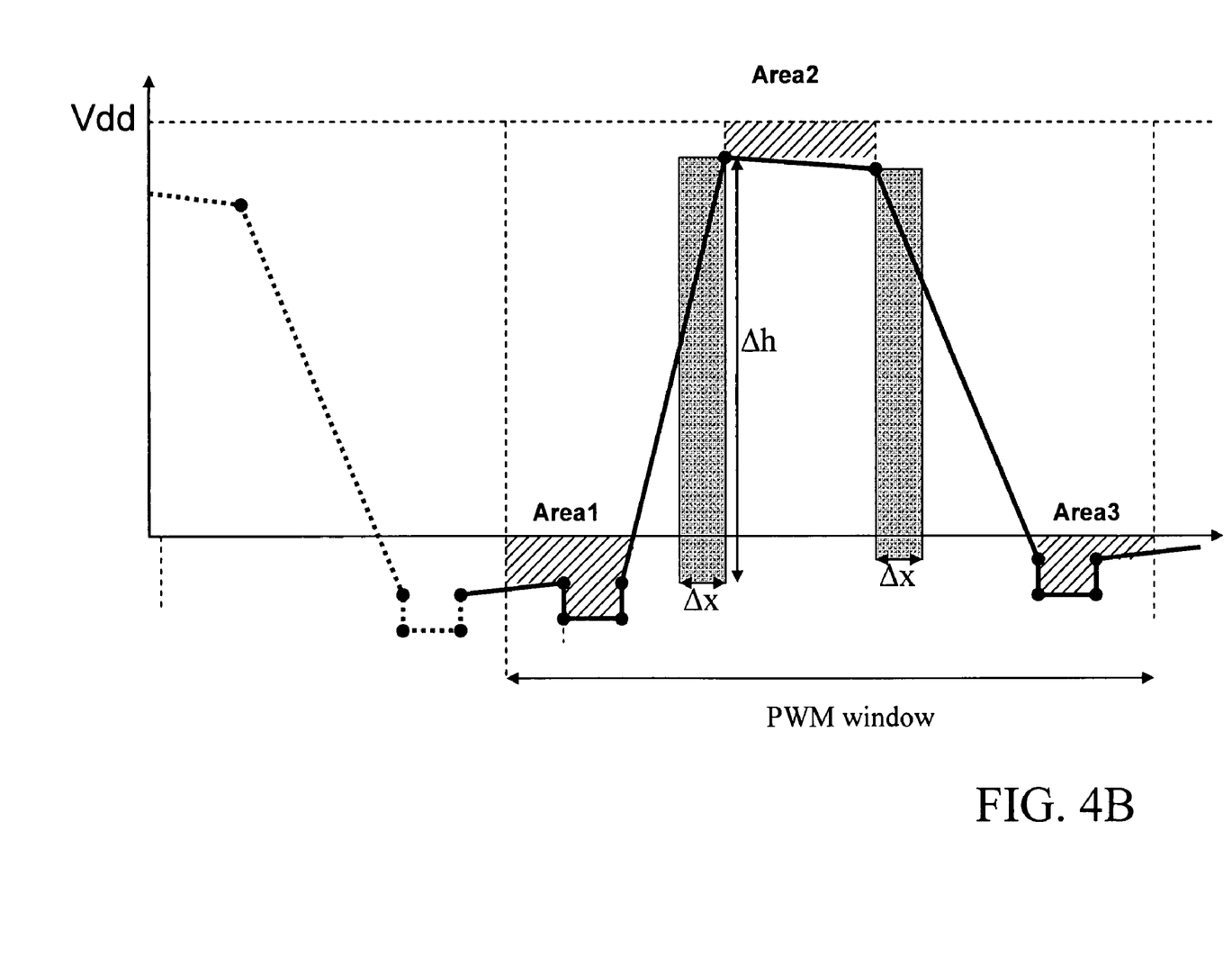

Step 3 is providing compensation by regulating the timing of a pulse width modulated control signal to be applied to switches of the power bridge. The step 2 process allows one to estimate, for a given input signal to the PWM modulator which would generate a certain PWM control signal, the output current from the power bridge in response to that PWM control signal. By evaluating the input signal to the PWM modulator, one can know that this signal will generate the certain PWM control signals and cause a switching of the power bridge. The step 2 analysis further indicates when that switching of the power bridge is about to occur. From the estimate of the output current, it is possible to obtain, through interpolation from the table stored in the first step of acquisition and estimation of non idealities, the values of the non idealities which characterize the bridge switching and thus the area error introduced by these non idealities. In this way, during the third regulation step of the control signal to be applied to the power bridge for its switch (i.e., the signal output from the PWM modulator) in response to an input (for example, audio) signal, the edge(s) of this control signal is(are) temporally shifted so as to prevent the area error, as schematically shown in FIGS. 4A and 4B.

This third compensation step with temporal regulation of the edge of the control signal to be applied to the power bridge is realized by the compensation block 3 which produces the signal S3 for application to the power bridge stage (for example, as shown in FIG. 1A).

Figure 5:
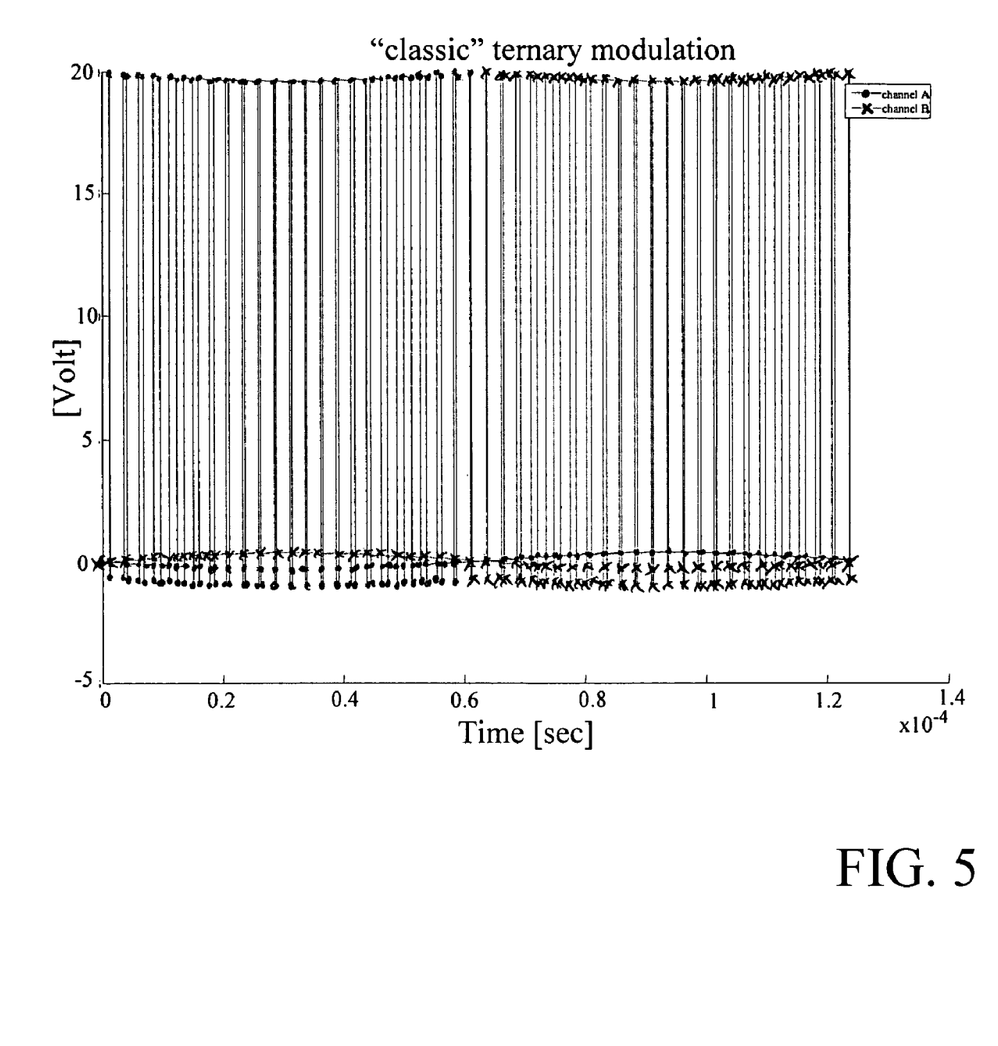
FIG. 5 shows the results of a simulation carried out on a compensation system according to the invention.
Figure 6:
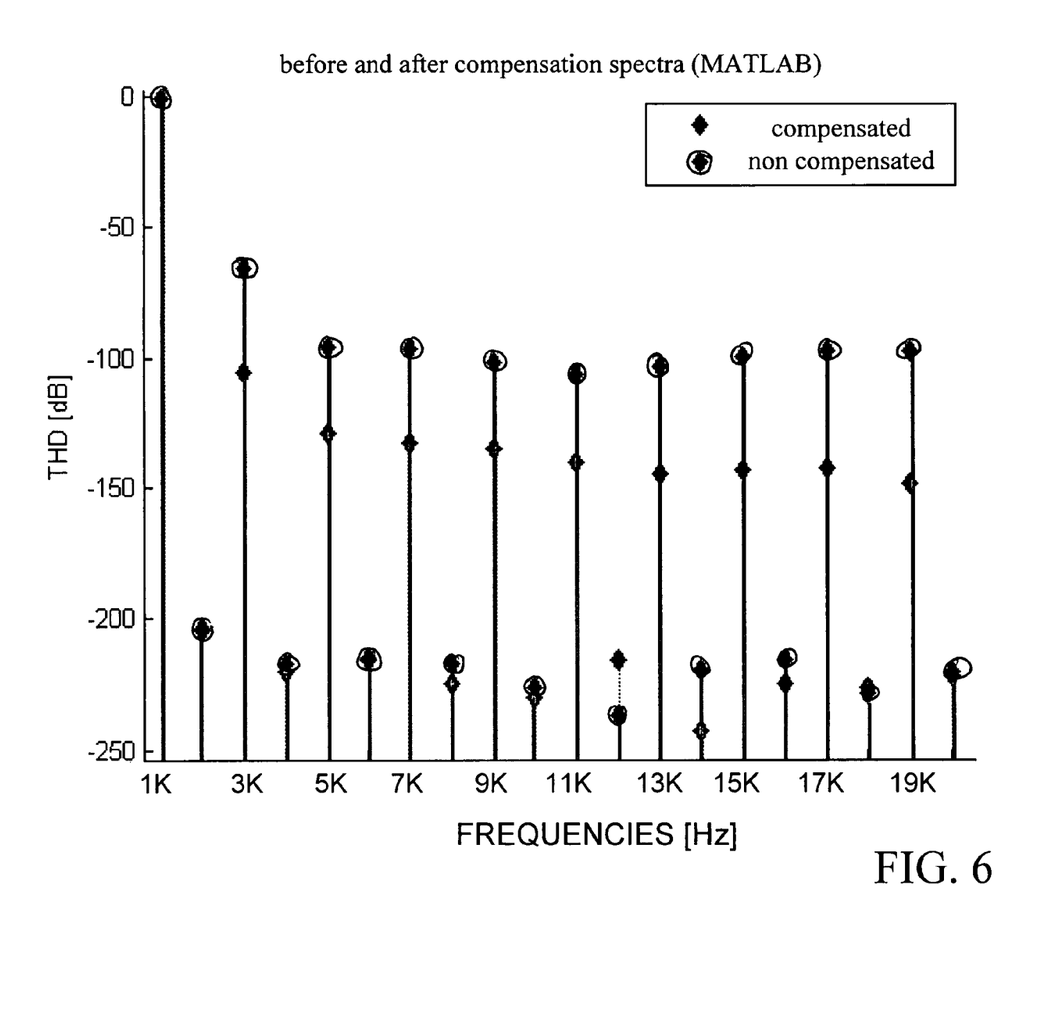
FIG. 6 shows the results of a comparison between a compensation system according to the invention and a non compensated system.

The results of simulations carried out by the Applicant on a compensation system implementing the method according to the invention are shown in FIGS. 5 and 6. In particular, FIG. 6 compares the spectra of output signals of a system as the one shown in FIG. 1B before and after the compensation according to the invention.

In conclusion, the system and the method according to the invention allow to realize a compensation with harmonic distortion correction of a power bridge in an open loop configuration and completely digitally, without external components.

The creation of the table of the non idealities according to the current at the output of the power bridge is advantageously realized starting from circuit simulations but also from direct measures on a real circuit, making the method valid also on already realized circuits, in case they provide the possibility of storing the table in storage supports on board of the circuit.

The current estimate realized according to the method of the invention is implemented in the digital circuit without particular difficulties, starting from digital data at the input of the PWM modulator comprised in the system.

The method and the system realized according to the invention are particularly interesting in the case of audio applications, where a high linearity—and consequently a very contained harmonic distortion—of the amplifiers used and, in particular, of the power bridges contained therein, is requested.

Although preferred embodiments of the device of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method, comprising:
   acquiring a form of an output pulse at the output of a power bridge in response to a bridge control input under each of a plurality of power bridge output current conditions for the power bridge;
   processing the output pulse form for each power bridge output current condition in order to estimate power bridge non idealities relating to errors in pulse area for the output pulse;
   storing the power bridge output current condition and associated estimated power bridge non idealities;
   processing an input signal through a model of said power bridge in order to estimate a power bridge output current in response to that input signal;
   using the estimated power bridge output current to retrieve from storage power bridge non idealities at the power bridge output current condition corresponding to the estimated power bridge output current; and
   regulating edge timing of a power bridge control signal for power bridge switch control in response to the retrieved power bridge non idealities so as to correct for errors in pulse area of the output pulse.

2. The method according to claim 1, wherein estimated non idealities comprise: variation in output pulse low level, variation in output pulse high level, delay in low to high switching of the output pulse and delay in high to low switching of the output pulse.

3. The method according to claim 1, wherein processing an input signal through a model of said power bridge comprises detecting an inductance current of a LC filter interposed between a resistive load and a power output terminal of the modeled power bridge.

4. The method according to claim 1, wherein regulating edge timing comprises temporally shifting an edge of a pulse control signal which is applied for causing switching of said power bridge.

5. A method, comprising:
   acquiring an output pulse at the output of a power bridge in response to a bridge control input under each of a plurality of power bridge output current conditions for the power bridge;
   processing the output pulse for each power bridge output current condition in order to estimate power bridge non idealities relating to errors in pulse area for the output pulse;
   storing the power bridge output current condition and associated estimated power bridge non idealities;
   processing a PWM input signal through a power bridge model to obtain an estimate of a power bridge output current in response to that PWM input signal;
   using the estimated power bridge output current to retrieve from storage power bridge non idealities at the power bridge output current condition corresponding to the estimated power bridge output current; and
   regulating edge timing of the PWM input signal in response to the retrieved power bridge non idealities so as to correct for errors in pulse area of the output pulse.

6. The method according to claim 5, wherein estimated non idealities comprise: variation in output pulse low level, variation in output pulse high level, delay in low to high switching of the output pulse and delay in high to low switching of the output pulse.

7. The method according to claim 5, wherein processing an input signal through a model of said power bridge comprises detecting an inductance current of a LC filter interposed between a resistive load and a power output terminal of the modeled power bridge.

8. The method according to claim 5, wherein regulating edge timing comprises temporally shifting an edge of the PWM input signal.

* * * * *